US012581812B2

(12) United States Patent
Sakuma et al.

(10) Patent No.: US 12,581,812 B2
(45) Date of Patent: Mar. 17, 2026

(54) DISPLAY DEVICE

(71) Applicant: SHARP KABUSHIKI KAISHA, Sakai City (JP)

(72) Inventors: Jun Sakuma, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 439 days.

(21) Appl. No.: 17/787,122

(22) PCT Filed: Dec. 23, 2019

(86) PCT No.: PCT/JP2019/050286
§ 371 (c)(1),
(2) Date: Jun. 17, 2022

(87) PCT Pub. No.: WO2021/130806
PCT Pub. Date: Jul. 1, 2021

(65) Prior Publication Data
US 2023/0020955 A1 Jan. 19, 2023

(51) Int. Cl.
*H10K 59/127* (2023.01)
*H01L 23/00* (2006.01)

(52) U.S. Cl.
CPC ........... *H10K 59/127* (2023.02); *H01L 24/32* (2013.01); *H10K 59/1275* (2023.02); *H01L 24/33* (2013.01); *H01L 2224/32057* (2013.01); *H01L 2224/32145* (2013.01); *H01L 2224/33517* (2013.01)

(58) Field of Classification Search
CPC .. H10K 59/1275; H10K 59/127; H01L 24/32; H01L 24/33; H01L 2224/32057; H01L 2224/32145; H01L 2224/33517
See application file for complete search history.

(56) References Cited

U.S. PATENT DOCUMENTS

| | | | |
|---|---|---|---|
| 2003/0127972 A1* | 7/2003 | Han | H10K 59/1275 313/504 |
| 2004/0129936 A1 | 7/2004 | Park et al. | |
| 2004/0189213 A1* | 9/2004 | Okazaki | H10K 59/1275 313/461 |

(Continued)

FOREIGN PATENT DOCUMENTS

JP 2007329138 A 12/2007

*Primary Examiner* — Matthew C Landau
*Assistant Examiner* — David W Ward
(74) *Attorney, Agent, or Firm* — ScienBiziP, P.C.

(57) ABSTRACT

A display device with high operation stability is provided. The display device comprises a first substrate, a second substrate, and a conductive fluid. The first substrate has a first insulating plate and a switching element. The switching element is formed on the first insulating plate. The second substrate has a second insulating plate, a first electrode, a light-emitting layer, and a second electrode. The second insulating plate faces the first insulating plate. The first electrode is formed on the second insulating plate. The light-emitting layer is formed on the first electrode. The second electrode is formed on the light-emitting layer. The second electrode faces the switching element. The conductive fluid is disposed between the first substrate and the second substrate. The conductive fluid electrically connects the switching element and the second electrode.

12 Claims, 5 Drawing Sheets

(56) References Cited

U.S. PATENT DOCUMENTS

| | | | |
|---|---|---|---|
| 2005/0145855 A1* | 7/2005 | Park | H10K 59/1213 |
| | | | 438/22 |
| 2005/0269967 A1 | 12/2005 | Park et al. | |
| 2006/0137901 A1* | 6/2006 | Yu | H10K 59/1275 |
| | | | 174/250 |
| 2007/0132374 A1* | 6/2007 | Park | H10K 59/1275 |
| | | | 313/506 |
| 2007/0145887 A1* | 6/2007 | Chae | H10K 59/8792 |
| | | | 313/506 |
| 2008/0018245 A1* | 1/2008 | Kim | H10K 59/1275 |
| | | | 438/34 |
| 2010/0019665 A1* | 1/2010 | Kwon | H10K 59/1275 |
| | | | 313/504 |
| 2010/0096655 A1* | 4/2010 | Lee | H10K 59/1275 |
| | | | 257/98 |
| 2013/0300284 A1* | 11/2013 | Nishido | H10K 59/127 |
| | | | 313/511 |
| 2014/0210109 A1* | 7/2014 | Tanaka | H01L 23/5389 |
| | | | 438/126 |
| 2015/0221712 A1* | 8/2015 | Yu | H10K 59/131 |
| | | | 438/23 |
| 2015/0318339 A1* | 11/2015 | Nakamura | H10K 50/841 |
| | | | 257/98 |
| 2017/0062514 A1* | 3/2017 | Park | H10D 30/6755 |
| 2019/0172893 A1* | 6/2019 | Lee | H10K 50/8426 |

* cited by examiner

DISPLAY DEVICE

TECHNICAL FIELD

The disclosure relates to a display device.

BACKGROUND ART

Japanese Unexamined Patent Application Publication No. 2007-329138 for instance discloses a dual-panel display device. The display device described in Japanese Unexamined Patent Application Publication No. 2007-329138 includes a first substrate and a second substrate. The first substrate is a thin-film transistor (TFT) substrate having TFTs. The second substrate has a first electrode, a light-emitting layer formed on the first electrode, and a second electrode formed on the light-emitting layer. That is, the display device described in Japanese Unexamined Patent Application Publication No. 2007-329138 is configured such that the first electrode, the second electrode, and the light-emitting layer are provided not on the first substrate to which the TFTs is formed, but on the second substrate. The display device described in Japanese Unexamined Patent Application Publication No. 2007-329138 is configured such that the TFTs, provided on the first substrate, and the second electrode, provided on the second substrate, are electrically connected to each other by an electrical-linking pattern.

SUMMARY

The display device described in Japanese Unexamined Patent Application Publication No. 2007-329138 is configured, as described above, such that the TFTs, provided on the first substrate, and the second electrode, provided on the second substrate, are electrically connected to each other by an electrical-linking pattern. Therefore, the electrical-linking pattern and at least one of the TFTs and second electrode are separated in some cases if, for instance, the display device described in Japanese Unexamined Patent Application Publication No. 2007-329138 deforms due to stress application. Accordingly, the display device descried in Japanese Unexamined Patent Application Publication No. 2007-329138 has low connection reliability. Hence, the display device described in Japanese Unexamined Patent Application Publication No. 2007-329138 unfortunately involves low operation stability.

The present disclosure aims mainly to provide a display device with high operation stability.

A display device in one aspect of the disclosure comprises a first substrate, a second substrate, and a conductive fluid. The first substrate has a first insulating plate and a switching element. The switching element is formed on the first insulating plate. The second substrate has a second insulating plate, a first electrode, a light-emitting layer, and a second electrode. The second insulating plate faces the first insulating plate. The first electrode is formed on the second insulating plate. The light-emitting layer is formed on the first electrode. The second electrode is formed on the light-emitting layer. The second electrode faces the switching element. The conductive fluid is disposed between the first substrate and the second substrate. The conductive fluid electrically connects the switching element and the second electrode.

DESCRIPTION OF EMBODIMENTS

Example preferred embodiments of the disclosure will be described. The following preferred embodiments are mere illustrative. The disclosure is not limited to the following embodiments.

First Embodiment

Figure 1:
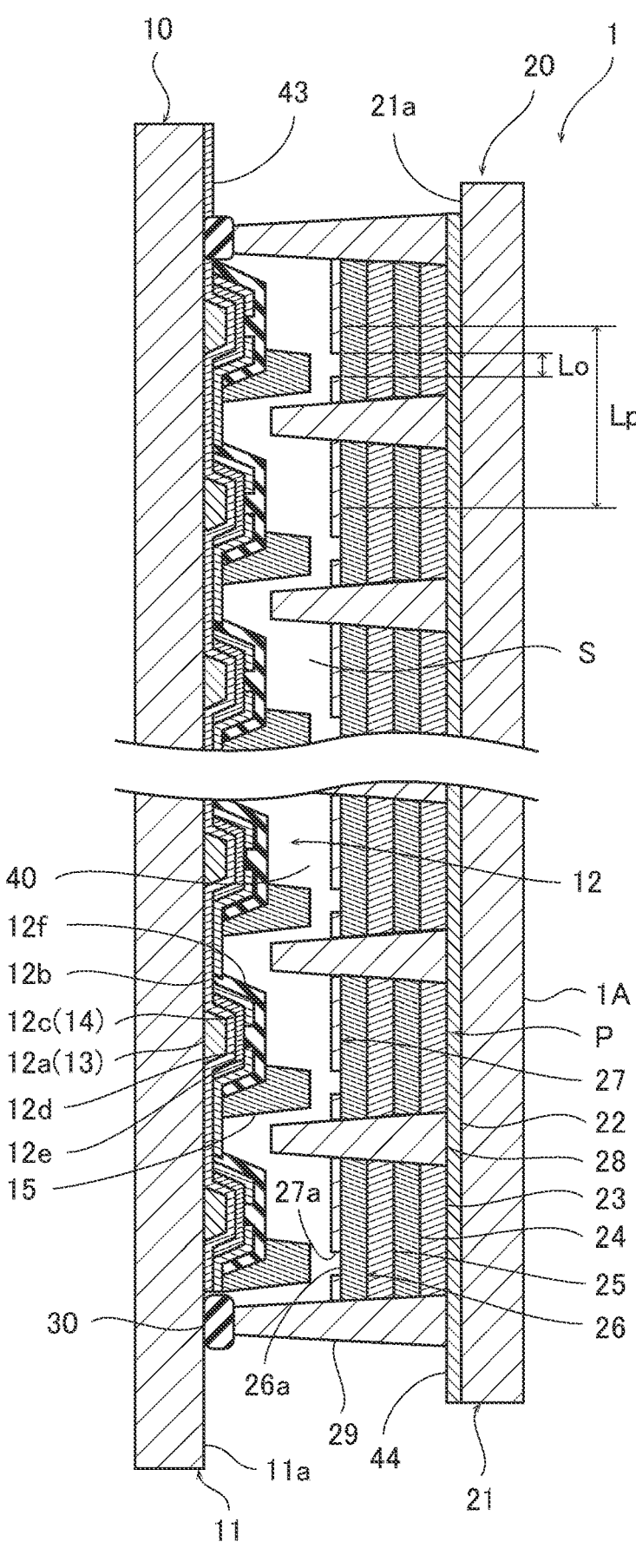
FIG. 1 is a schematic sectional view of a display device according to a first embodiment.

FIG. 1 is a schematic sectional view of a display device 1 according to a first embodiment.

The display device 1 has a plurality of pixels P. The plurality of pixels P are arranged in in matrix.

The display device 1 has a first substrate 10 and a second substrate 20, as illustrated in FIG. 1. The first substrate 10 and the second substrate 20 face each other.

First Substrate 10

The first substrate 10 is a substrate having switching elements 12, which will be described later on. The first substrate 10 in this embodiment has thin-film transistors (TFTs) as the switching elements 12. Therefore, the first substrate 10 is also called a TFT substrate in some cases.

The first substrate 10 has a first insulating plate 11. The first insulating plate 11 is a substrate having an insulating main surface 11a, which is adjacent to the second substrate 20. The first insulating plate 11 may be composed of an insulating material in whole, or a conductive substrate and an insulating layer disposed on the conductive substrate, for instance. The first insulating plate 11 can be composed of, but not limited to, a glass substrate or a resin substrate.

The switching elements 12 are formed on the main surface 11a of the first insulating plate 11. To be specific, a plurality of switching elements 12 are arranged in matrix on the main surface 11a of the first insulating plate 11. At least one switching element 12 is provided for each of the plurality of pixels P. In the example shown in FIG. 1, a single switching element 12 is provided for each of the plurality of pixels P.

Each of the plurality of switching elements 12 has a gate electrode 12a, agate insulating film 12b, a source electrode 12c, a channel layer 12d, and a drain electrode 12e.

The gate electrode 12a is formed on the main surface 11a of the first insulating plate 11. The gate electrode 12a is electrically connected to a gate line (first signal line) 13, which is formed on the main surface 11a. A plurality of gate lines 13 are formed on the main surface 11a. Each of the plurality of gate lines 13 extends in one direction (a direction perpendicular to the drawing sheet of FIG. 1). The plurality of gate lines 13 are spaced from each other in another direction, which is perpendicular to the one direction.

The gate insulating film (interlayer insulating film) 12b is disposed on the gate electrode 12a and the gate line 13. The channel layer 12d is formed on the gate insulating film 12b. The channel layer 12d covers the gate electrode 12a.

The source electrode 12c is formed on a part of the channel layer 12d. The source electrode 12c has a portion facing the gate electrode 12a with the channel layer 12d and gate insulating film 12b interposed therebetween. The source electrode 12c is electrically connected to a source line (second signal line) 14. A plurality of source lines 14 are formed on the gate insulating film 12b and the channel layer 12d. Each of the plurality of source lines 14 extends in a direction crossing (typically, orthogonal to) the direction where the gate lines 13 extend. The plurality of source lines 14 are spaced from each other in the direction where the gate lines 13 extend.

The drain electrode 12e is disposed on a part of the channel layer 12d excluding the portion where the source electrode 12c is disposed. The drain electrode 12e and the source electrode 12c are spaced from each other.

An insulating member (insulting film) 12f is formed on the channel layer 12d exposed from the source electrode 12c and drain electrode 12e as well as on parts of the source electrode 12c and drain electrode 12e. The insulating member 12f covers the channel layer 12d exposed from the source electrode 12c and drain electrode 12e and covers parts of the source electrode 12c and drain electrode 12e. The drain electrode 12e is partly exposed from the insulating member 12f.

The plurality of switching elements 12, each including the gate electrode 12a, the gate insulating film 12b, the source electrode 12c, the channel layer 12d, and the drain electrode 12e, are spaced from each other, as described above.

Provided in each of the plurality of switching elements 12 is a conductive member 15 on the drain electrode 12e exposed from the insulating member 12f. The conductive member 15 is electrically connected to the switching element 12. The conductive member 15 extends from the drain electrode 12e toward the second substrate 20.

The conductive member 15 can be composed of a conductive material for instance. To be specific, the conductive member 15 can be made of metal, including aluminum and copper, or conductive resin containing a conductive material, for instance. The conductive member 15 may be composed of, for instance, a body made of an insulating material and a conductive layer disposed on at least a part of the body.

Second Substrate 20

The second substrate 20 faces the first substrate 10. To be specific, the second substrate 20 faces a surface of the first substrate 10 on which the plurality of switching elements 12 are arranged.

The second substrate 20 has a second insulating plate 21. The second insulating plate 21 is a substrate having an insulating main surface 21a, which is adjacent to the first substrate 10. The second insulating plate 21 may be composed of an insulating material in whole, or a conductive substrate and an insulating layer formed on the conductive substrate, for instance. The second insulating plate 21 can be composed of, but not limited to, a glass substrate or a resin substrate.

On the main surface 21a of the second insulating plate 21, a first electrode 22 is formed. In this embodiment, a single first electrode 22 is formed on the main surface 21a. The first electrode 22 extends astride the plurality of pixels P. That is, the first electrode 22 is shared among the plurality of pixels P. The first electrode 22 preferably has transparency to light. The first electrode 22 can be made of a transparent conductive oxide (TCO) for instance.

On the first electrode 22, a light-emitting layer 24 is formed. To be specific, a plurality of light-emitting layers 24 are formed on the first electrode 22. The plurality of light-emitting layers 24 are provided in such a manner that a single light-emitting layer 24 is located in each of the plurality of pixels P.

The light-emitting layers 24 are electroluminescence layers that emit light upon voltage application. The light-emitting layers 24 may be organic light-emitting diode (OLED) layers, or quantum-dots light-emitting diode (QLED) layers containing quantum dots, for instance. This embodiment will describe an instance where the light-emitting layers 24 are each an OLED layer.

On the light-emitting layers 24, second electrodes 26 are formed. The second electrodes 26 face the switching elements 12 of the first substrate 10. In detail, each second electrode 26 faces the exposed part of the drain electrode 12e of the switching element 12. In further detail, the second electrode 26 faces the distal end of the conductive member 15, which is connected to the exposed part of the drain electrode 12e. The second electrode 26 and the first electrode 22 inject electric charge, such as holes and electrons, into the light-emitting layer 24. In this embodiment, the first electrode 22 is an anode that injects holes into the light-emitting layer 24, and the second electrode 26 is a cathode that injects electrons into the light-emitting layer 24.

The display device 1 is configured such that light from the light-emitting layers 24 exits by way of the second substrate 20. Therefore, the second electrode 26, located closer to the first substrate 10 than the light-emitting layer 24, is preferably a reflective electrode having high reflectivity of light that exits from the light-emitting layer 24. The second electrode 26 in this case preferably includes a metal layer for instance.

At least one charge transport layer is preferably disposed between the light-emitting layer 24 and the first electrode 22. To be specific, at least one of a hole transport layer and a hole injection layer is preferably disposed between the light-emitting layer 24 and the first electrode 22. In this embodiment, a hole transport layer 23 is disposed between the light-emitting layer 24 and the first electrode 22. The hole transport layer 23 is a layer that improves the efficiency of transport of holes injected from the first electrode 22 to the light-emitting layer 24 (hole transport efficiency). The disclosure is not limited to this configuration, as a matter of course. The first electrode and the light-emitting layer may be in direct contact.

At least one charge transport layer is preferably disposed between the light-emitting layer 24 and the second electrode 26. To be specific, at least one of an electron transport layer and an electron injection layer is preferably disposed between the light-emitting layer 24 and the second electrode 26. In this embodiment, an electron transport layer 25 is disposed between the light-emitting layer 24 and the second electrode 26. The electron transport layer 25 is a layer that improves the efficiency of transport of electrons injected from the second electrode 26 to the light-emitting layer 24 (electron transport efficiency).

On the second electrode 26, an insulator (insulating film) 27 is formed. A portion excluding a part of the second electrode 26 is covered by the insulator 27. To be specific, the insulator 27 has an opening 27a, from which the second electrode 26 is exposed. A portion excluding an exposed portion 26a of the second electrode 26 is covered by the insulator 27. The exposed portion 26a is provided in a facing direction, which is a direction where the first substrate 10 and the second substrate 20 face each other, so as to face at least a part of the conductive member 15 for instance.

The hole transport layer 23, the light-emitting layer 24, the electron transport layer 25, the second electrode 26, and the insulator (insulating film) 27 are provided for each of the plurality of pixels P. An insulating member (bank) 28 is disposed between the hole transport layer 23, light-emitting layer 24, electron transport layer 25, second electrode 26 and insulator 27 constituting one pixel P, and the hole transport layer 23, light-emitting layer 24, electron transport layer 25, second electrode 26 and insulator 27 constituting another pixel P adjacent to the one pixel P. The insulating member 28 is formed on the first electrode 22. The insulating member 28 protrudes from the first electrode 22 farther toward the first substrate 10 than the second electrode 26. The hole transport layer 23, light-emitting layer 24, electron transport layer 25, second electrode 26 and insulator 27 constituting the one pixel P are separated from the hole transport layer 23, light-emitting layer 24, electron transport layer 25, second electrode 26 and insulator 27 constituting the another pixel P adjacent to the one pixel P by the insulating member 28.

It is noted that the distal end of the insulating member 28 and the distal end of the conductive member 15 overlap in the surface direction of a light-exit surface 1A of the display device 1. That is, the conductive member 15 extends farther toward the second substrate 20 than an end of the insulating member 28 adjacent to the first substrate 10.

Aspect of Joining Between First Substrate 10 and Second Substrate 20

The first substrate 10 and the second substrate 20 are spaced from each other in such a manner than the switching elements 12 and the second electrodes 26 face. On the main surface 21a of the second insulating plate 21 belonging to the second substrate 20, a sealing member 29 is formed. The sealing member 29 is provided in the form of a frame so as to surround the plurality of pixels P. The distal end of the sealing member 29 and the first substrate 10 are joined by a joining material 30. Therefore, disposed between the first substrate 10 and the second substrate 20 is an inner space S surrounded by the sealing member 29.

Between the first substrate 10 and the second substrate 20, a conductive fluid 40 is disposed. To be specific, the conductive fluid 40 is filled in the inner space S. That is, the sealing member 29 connects the first substrate 10 and the second substrate 20 and surrounds the perimeter of the conductive fluid 40.

Herein, a "conductive fluid" is a fluid having conductivity. That "having conductivity" refers to that electrical resistivity stands at $10^8$ Ωcm or less. A "fluid" includes at least a liquid, a gas, a sol, and a gel.

The conductive fluid 40 is preferably a conductive liquid. Examples of the conductive fluid 40 preferably used include a liquid metal, an ion liquid, a conductive-particle dispersion liquid, which is a liquid with conductive particles dispersed therein, and a conductive grease. It is noted that "liquid metal" refers to metals having a melting point equal to or lower than room temperature (25° C.). Specific examples of the liquid metal include mercury and gallium alloy, such as Galinstan (alloy of gallium, indium, and tin). Specific examples of the ion liquid include an imidazolium-based ion liquid, such as 1-aryl-3-octylimidazoliumbis(fluorosulfonyl)imide, a pyrrolidinium-based ion liquid, such as 1-methyl-1-propylpyrrolidiniumbis(fluorosulfonyl)imide, a piperidinium-based ion liquid, such as 1-methyl-1-propylpiperidiniumbis(fluorosulfonyl)imide, an ammonium-based ion liquid, and a phosphonium-based ion liquid. A specific example of the conductive-particle dispersion liquid is a dispersion liquid with conductive particles, including graphite particles (e.g., carbon nanotubes, graphene, or graphite), gold particles, and silver particles, dispersed in a liquid, including water, alcohol (e.g., ethanol or isopropyl alcohol), hexane, toluene, N-methylpyrrolidinone, and methylethylketone. A specific example of the conductive grease is a mixture of conductive particles and silicone grease.

The conductive fluid 40 may contain a thickener or a gelatinizing agent.

The switching element 12 and the second electrode 26 in the display device 1 are electrically connected by the conductive fluid 40. Therefore, the electrical connection between the switching element 12 and the second electrode 26 can be maintained with certainty by the conductive fluid 40 even if, for instance, the display device 1 receives a stress to be deformed. Hence, the reliability of connection between the switching element 12 and the second electrode 26 is high in the display device 1. The display device 1 thus has high operation stability.

When, for instance, a switching element and a second electrode are brought into electrical connection using a solid conductive material, stress application to a display device can bring at least one of the switching element and the second electrode into contact with the solid conductive material, thereby possibly causing breakage in the switching element or the second electrode. The display device 1 by contrast effectively prevents the switching element 12 or the second electrode 26 from breakage resulting from contact with another member. The display device 1 consequently has higher operation stability.

The display device 1 is preferably configured such that the switching element 12 and the second electrode 26, constituting each pixel P, are electrically connected by the conductive fluid 40, and such that the switching element 12 included in one pixel P and the second electrode 26 included in another pixel P are not electrically connected by the conductive fluid 40. This configuration can prevent crosstalk between the pixels P.

It is noted that "not electrically connected" refers to that the electrical resistivity between the switching element 12 and the second electrode 26 is electrical resistivity of a degree to which an electrical signal from the switching element 12 is not input to the second electrode 26 substantially.

To more effectively prevent crosstalk between the pixels P adjacent to each other, the display device 1 is preferably configured to be driven in such a manner that when the switching element 12 in one pixel P remains ON, the switching element 12 in another pixel P adjacent to the one pixel P is not turned on (remains OFF). The display device 1 preferably includes a control unit for instance, that controls the plurality of switching elements 12 in such a manner that when the switching element 12 in one pixel P remains ON, the switching element 12 in another pixel P adjacent to the one pixel P remains OFF.

To prevent crosstalk between the pixels P adjacent to each other, the electrical resistivity between the switching element 12 (in detail, the drain electrode 12e of the switching element 12) and second electrode 26 within each pixel P is preferably low.

From the foregoing view point, the conductive member 15 is preferably provided that is electrically connected to the switching element 12 and protrudes from the switching element 12 toward the second electrode 26. To more effectively prevent crosstalk between the pixels P adjacent to each other, the conductive member 15 preferably has electrical resistivity equal to or lower than the electrical resistivity of the conductive fluid 40.

As described above, lowering the electrical resistivity between the switching element 12 and second electrode 26 within one pixel P is important to prevent crosstalk between the pixels P adjacent to each other. It is also preferable to increase the electrical resistivity between the switching element 12 in one pixel P and the second electrode 26 in the another pixel P. From this view point, the insulating member 28 is preferably provided that separates the light-emitting layer 24 and second electrode 26 in one pixel P from the light-emitting layer 24 and second electrode 26 in another pixel P. The insulating member 28 is further preferably protrudes farther toward the first substrate 10 than the second electrode 26. Furthermore, the insulator 27 that exposes a portion facing the conductive member 15 is preferably provided on the second electrode 26.

The ratio of Lo to Lp (Lo/Lp) preferably falls within a range of 1/2±10% in order to lower the electrical resistivity between the switching element 12 and second electrode 26 within one pixel P, and to increase the electrical resistivity between the switching element 12 in the one pixel P and the second electrode 26 in the another pixel P.

Herein, Lp denotes the distance between the drawing center of the second electrode 26 in one pixel P and the drawing center of the second electrode 26 in another pixel P, and Lo denotes the distance (shortest distance) between the exposed portion 26a of the second electrode 26 from the insulator 27 in one pixel P and the exposed portion 26a of the second electrode 26 from the insulator 27 in another pixel P adjacent to the one pixel P.

Each of the conductive members 15 preferably extends farther toward the second substrate 20 than the end of the insulating member 28 adjacent to the first substrate 10, in order to lower the electrical resistivity between the switching element 12 and second electrode 26 in one pixel P, and to increase the electrical resistivity between the switching element 12 in the one pixel P and the second electrode 26 in the another pixel P. This configuration can elongate the conductive path between the conductive member 15 in one pixel P and the second electrode 26 in another pixel P while shortening the conductive path between the conductive member 15 and the second electrode 26.

For the foregoing view point, the distance between the insulating member 28 and the first substrate 10 is preferably shortened as much as possible, and more desirably, the insulating member 28 is provided so as to be in contact with the first substrate 10. In this case in particular, the top of the insulating member 28, adjacent to the first substrate 10, is preferably composed at least of an elastic member. This can prevent damage resulting from contact between the insulating member 28 and the first substrate 10.

The resistance between the switching element 12 in one pixel P and the second electrode 26 in the another pixel P is preferably $3 \times 10^4$ times or greater of the resistance between the switching element 12 and second electrode 26 within the one pixel P.

The insulating member 28 in whole may be composed of an elastic member; alternatively, the insulating member 28 may be composed of a body consisting of metal and other materials, and an elastic part disposed on the body and consisting of an elastic member. It is noted that an "elastic member" in the disclosure refers to one having a Young's modulus of 10 GPa or less. The elastic member preferably has a Young's modulus of 1 GPa or less.

A specific example of the elastic member preferably used is elastomers, such as rubber.

Manufacturing Method of Display Device 1

A manufacturing method of the display device 1 is not particularly limited. The display device 1 can be manufactured through a one-drop-fill (ODF) process for instance, as described below.

To be specific, first, the first substrate 10 and the second substrate 20 are prepared. Next, the conductive fluid 40 is applied onto at least one of the first substrate 10 and the second substrate 20. Preferably, the conductive fluid 40 is applied onto the second substrate 20. A method for applying the conductive fluid 40 is not particularly limited. For instance, the conductive fluid 40 may be dropped onto a plurality of locations of the second substrate 20. It is preferable to provide the insulating member 28 with a part lower than the other parts so that the dropped conductive fluid 40 easily spreads uniformly. That is, the insulating member 28 preferably has a relatively low part and a relatively high part.

Thereafter, the first substrate 10 and the second substrate 20 are joined, and thereby, the display device 1 can be manufactured. It is noted that the joining between the first substrate 10 and the second substrate 20 is preferably performed in a reduced-pressure atmosphere. By doing so, it is possible to suppress bubbles from remaining in the inner space S.

Other example preferred embodiments of the disclosure will be described. In the following description, components having functions that are substantially common with those in the foregoing embodiment will be denoted by common symbols, and their descriptions will be omitted.

Second Embodiment

Figure 2:
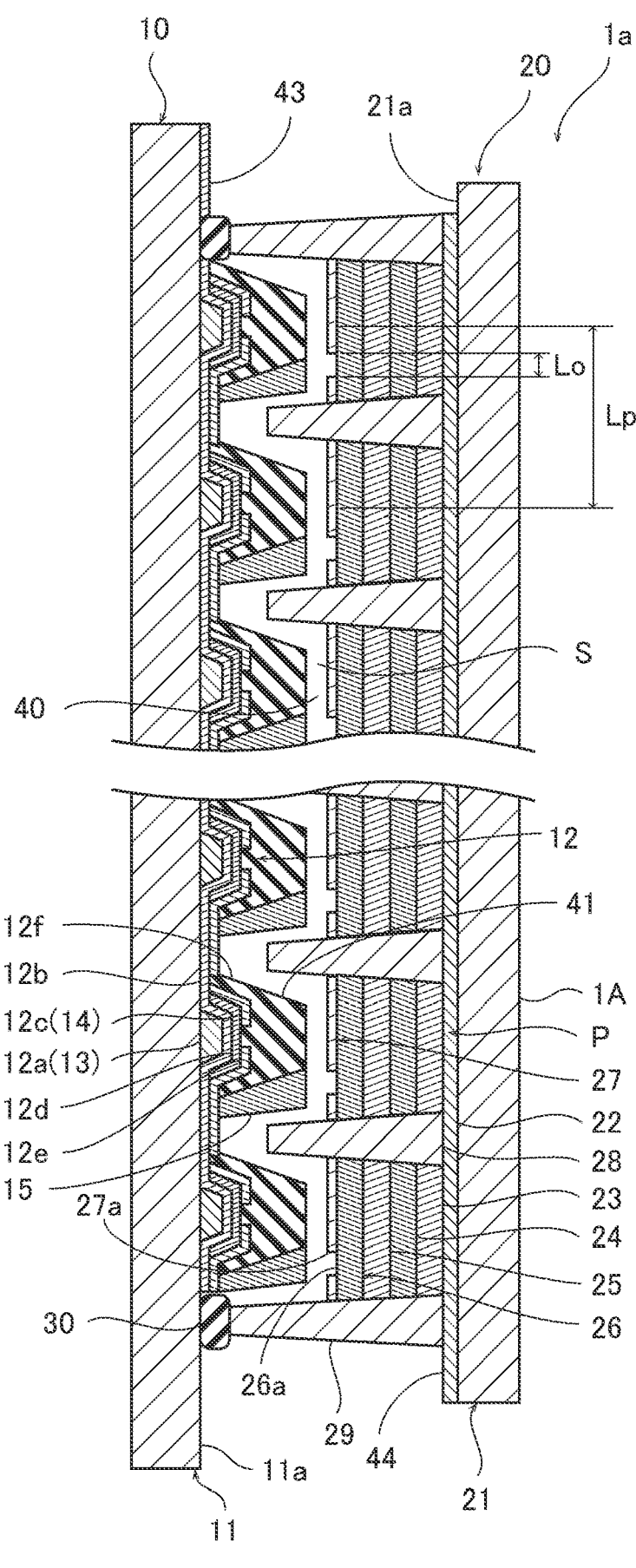
FIG. 2 is a schematic sectional view of a display device according to a second embodiment.

FIG. 2 is a schematic sectional view of a display device 1a according to a second embodiment.

The display device 1a according to the second embodiment is different from the display device 1 according to the first embodiment in that the display device 1a includes other insulating members 41.

A insulating member 41 is located between a portion where the conductive member 15 and second electrode 26 in one pixel P face each other and a portion where the conductive member 15 and second electrode 26 in another pixel P adjacent to the one pixel P face each other. The insulating member 41 protrudes from the first substrate 10 farther toward the second substrate 20 than an end of the insulating member 28 adjacent to the first substrate 10.

The display device 1a includes such insulating members 41 as described above. Therefore, it is possible to elongate the conductive path between the switching element 12 in one pixel P and the second electrode 26 in another pixel P adjacent to the one pixel P and to reduce the transverse area of the conductive path. Crosstalk between the pixels P adjacent to each other can be consequently prevented more effectively.

The insulating member (another insulating member) 41 and the insulating member 28 are preferably in contact in order to more effectively prevent crosstalk between the pixels P adjacent to each other.

In the present embodiment, an explanation has been made about an example where the insulating member 41 is integrated with the insulating member 12f. However, the disclosure is not limited to this configuration. The insulating member (another insulating member) 41 may be provided separately from the insulating member 12f, for instance.

At least one of the insulating members 41, 12f, and 28 is preferably an organic insulating member composed of an organic insulator. Specific examples of the organic insulator include resins and polymers, such as rubber.

Third Embodiment

Figure 3:
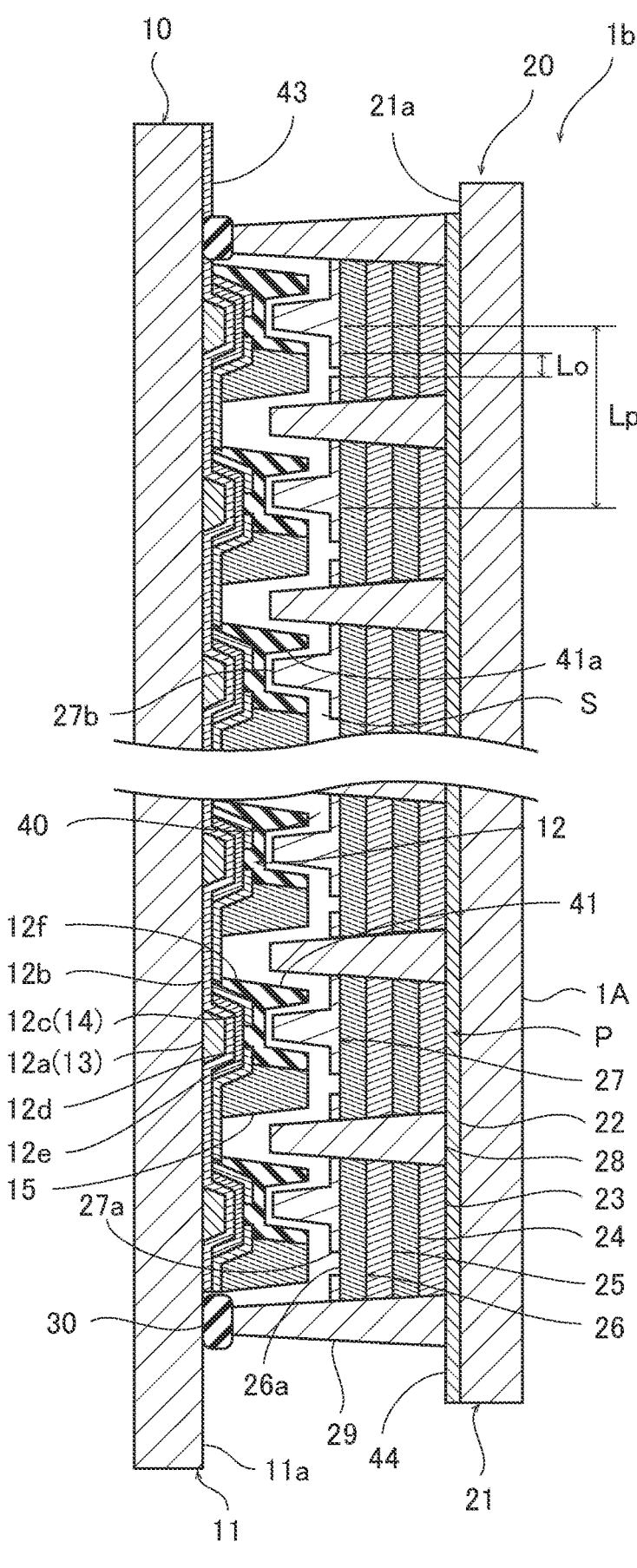
FIG. 3 is a schematic sectional view of a display device according to a third embodiment.

FIG. 3 is a schematic sectional view of a display device 1b according to a third embodiment.

The display device 1b according to the third embodiment is different from the display device 1a according to the second embodiment in the following point. That is, the insulating member 41 in the display device 1b has a recess 41a. The recess 41a is formed at the top of the insulating member 41. The recess 41a is dented toward the first insulating plate 11. The insulator 27 has a portion located in the recess 41a. In detail, the insulator 27 has a protrusion 27b protruding toward the first substrate 10. The protrusion 27b is partly located in the recess 41a.

The display device 1b according to the third embodiment includes the insulator 27 having a portion located in the recess 41a of the insulating member 41, as described above. Therefore, it is possible to elongate the conductive path between the switching element 12 in one pixel P and the second electrode 26 in another pixel P adjacent to the one pixel P and to reduce the transverse area of the conductive path. Accordingly, crosstalk between the pixels P adjacent to each other is suppressed more effectively.

In this embodiment, the insulator 27 and the insulating member 41 are disposed away from each other. However, the disclosure is not limited to this configuration. The insulator 27 and the insulating member 41 may be in contact for instance.

The first to third embodiments have described an instance where the insulator 27 is formed on the second electrode 26. However, the disclosure is not limited to this configuration. For instance, an insulator does not have to be formed on the second electrode.

Fourth Embodiment

Figure 4:
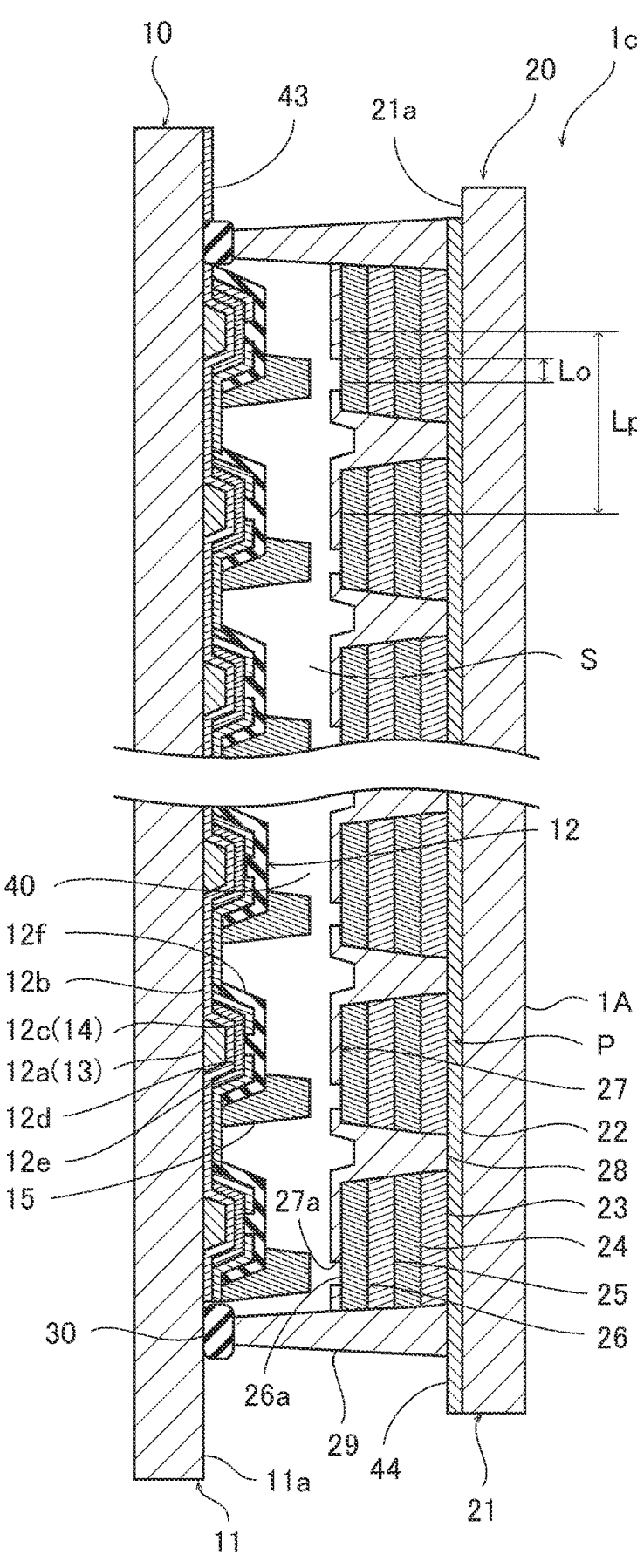
FIG. 4 is a schematic sectional view of a display device according to a fourth embodiment.

FIG. 4 is a schematic sectional view of a display device 1c according to a fourth embodiment.

The foregoing has described an instance where each of the display devices 1, 1a, and 1c according to the respective first to third embodiments includes the insulating member 28 protruding farther toward the first substrate 10 than the second electrode 26. However, the disclosure is not limited to this configuration.

The insulating member 28 does not have to protrude farther toward the first substrate 10 than the second electrode 26, like the display device 1c according to the fourth embodiment illustrated in FIG. 4 for instance.

The insulating member 28 and the insulator 27 may be integrated.

Fifth Embodiment

Figure 5:
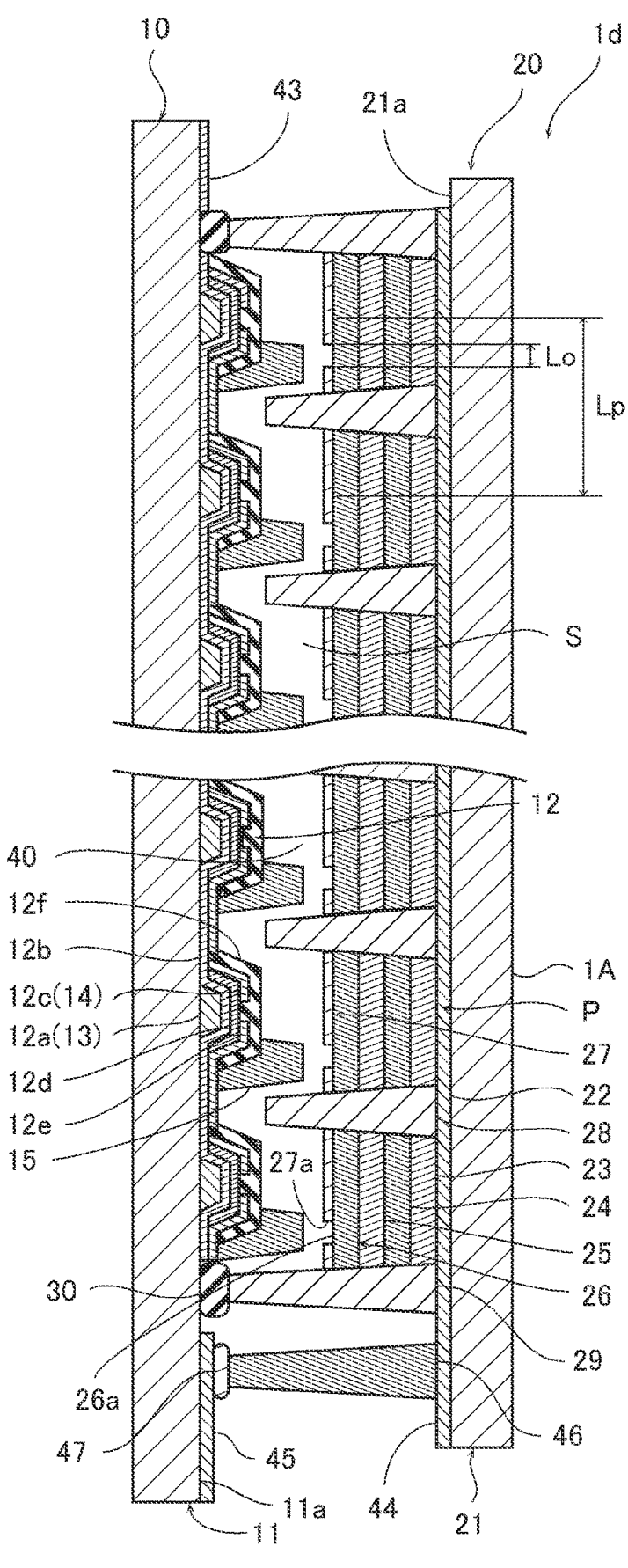
FIG. 5 is a schematic sectional view of a display device according to a fifth embodiment.

FIG. 5 is a schematic sectional view of a display device 1d according to a fifth embodiment.

In each of the display devices 1, 1a, 1b, and 1c according to the first to fourth embodiments, an explanation has been made about an example where a pull-out wire 43 pulling at least one of the gate line 13 and the source line 14 outside the sealing member 29 is formed on the first insulating plate 11, while a pull-out wire 44 pulling the first electrode 22 outside the sealing member 29 is formed on the second insulating plate 21.

In the display device 1d according to the fifth embodiment, an explanation has been made about an example where a pull-out wire 45 is further formed on a portion of the first insulating plate located outside the sealing member 29. The pull-out wire 45 is electrically connected to the pull-out wire 44. To be specific, the pull-out wire 45 is electrically connected to the pull-out wire 44 via a connecting member 46 and a conductive adhesive layer 47 that are formed above the pull-out wire 44.

In the display device 1d, the pull-out wire 43, electrically connected to at least one of the gate line 13 and the source line 14, and the pull-out wire 45, electrically connected to the first electrode 22, are formed on the same, first insulating plate 11. Therefore, by connecting a single external terminal to the first insulating plate 11 for instance, it is possible to connect the pull-out wire 43 and pull-out wire 45 electrically to an external device.

The invention claimed is:

1. A display device comprising:
a first substrate having a first insulating plate and a switching element disposed on the first insulating plate;
a second substrate having a second insulating plate facing the first insulating plate, a first electrode formed on the second insulating plate, a light-emitting layer formed on the first electrode, and a second electrode formed on the light-emitting layer and facing the switching element;
a conductive fluid disposed between the first substrate and the second substrate as well as connecting the switching element and the second electrode; and
a sealing member connecting the first substrate and the second substrate and surrounding a perimeter of the conductive fluid, wherein:
the second substrate further has a first pull-out wire formed on a portion of the second insulating plate located outside the sealing member and electrically connected to the first electrode, and
the first substrate further has:
a signal line formed on the first insulating plate and electrically connected to the switching element,
a second pull-out wire disposed on a portion of the first insulating plate located outside the sealing member and electrically connected to the signal line, and
a third pull-out wire electrically connected to the first pull-out wire, wherein the third pull-out wire is provided on another portion of the first insulating plate and is connected to the first pull-out wire by a connecting member located outside the sealing member and on a side opposite a conductive fluid's side of the sealing member.

2. The display device according to claim 1, wherein
the first substrate has a plurality of switching elements, including the switching element,
the plurality of switching elements includes one switching element and another switching element adjacent to each other,
the second substrate has a plurality of first electrodes, including the first electrode, a plurality of light-emitting layers, including the light-emitting layer, and a plurality of second electrodes, including the second electrode,
the plurality of light-emitting layers includes one light-emitting layer and another light-emitting layer adjacent to each other,
the plurality of second electrodes includes one second electrode formed on the one light-emitting layer, and another second electrode formed on the other light-emitting layer,
the one switching element and the one second electrode are electrically connected by the conductive fluid, and
the other switching element and the other second electrode are electrically connected by the conductive fluid.

3. The display device according to claim 2, wherein the first substrate further has:

a first conductive member electrically connected to the one switching element and protruding from the one switching element toward the one second electrode, and a second conductive member electrically connected to the other switching element and protruding from the other switching element toward the other second electrode.

4. The display device according to claim 3, wherein the second substrate further has an insulating member insulating the one light-emitting layer and the one second electrode from the other light-emitting layer and the other second electrode.

5. The display device according to claim 4, wherein the insulating member protrudes farther toward the first substrate than the second electrode.

6. The display device according to claim 4, wherein a top of the insulating member adjacent to the first substrate is composed of an elastic member.

7. The display device according to claim 4, wherein each of the first conductive member and the second conductive member extends farther toward the second substrate than an end of the insulating member adjacent to the first substrate.

8. The display device according to claim 4, wherein the first conductive member faces a part of the one second electrode, and the second substrate further has:

one insulator formed on the one second electrode and exposing a part of a portion of the one second electrode facing the first conductive member in a direction where the first substrate and the second substrate face, and another insulator disposed on the other second electrode and exposing a part of a portion of the other second electrode facing the second conductive member in the direction where the first substrate and the second substrate face.

9. The display device according to claim 8, wherein a ratio of a distance of the one second electrode exposed between the one insulator and the other insulator to a distance between a drawing center of the one second electrode and a drawing center of the other second electrode is within a range of 1/2±10%.

10. The display device according to claim 4, further comprising another insulating member located between a portion where the first conductive member and the one second electrode face and a portion where the second conductive member and the other second electrode face, the other insulating member protruding from the first substrate farther toward the second substrate than an end of the insulating member adjacent to the first substrate.

11. The display device according to claim 8, further comprising another insulating member located between a portion where the first conductive member and the one second electrode face and a portion where the second conductive member and the other second electrode face, the other insulating member protruding from the first substrate farther toward the second substrate than an end of the insulating member adjacent to the first substrate, wherein a recess dented toward the first substrate is disposed in the other insulating member, and the one insulator has a portion located in the recess.

12. The display device according to claim 1, wherein the conductive fluid contains at least one selected from the group consisting of a liquid metal, an ion liquid, a conductive-particle dispersion liquid, and a conductive grease.

*    *    *    *    *